United States Patent [19]

Uchida et al.

[11] Patent Number: 4,926,378
[45] Date of Patent: May 15, 1990

[54] BIPOLAR STATIC RAM HAVING TWO WIRING LINES FOR EACH WORD LINE

[75] Inventors: Akihisa Uchida, Tachikawa; Ichiro Mitamura; Keiichi Higeta, both of Ohme, all of Japan

[73] Assignee: Hitachi, Ltd., Tokyo, Japan

[21] Appl. No.: 160,259

[22] Filed: Feb. 25, 1988

[30] Foreign Application Priority Data

Mar. 18, 1987 [JP] Japan .................. 62-61031

[51] Int. Cl.$^5$ .......................... G11C 11/34
[52] U.S. Cl. ...................... 365/179; 365/174; 365/154; 365/149; 357/23.9; 357/45
[58] Field of Search .............. 365/63, 51, 155, 179, 365/149, 72, 174, 183, 154; 357/45, 23.6, 23.9

[56] References Cited

U.S. PATENT DOCUMENTS

| | | | |
|---|---|---|---|
| 3,397,393 | 8/1968 | Palmateer et al. | 365/63 |
| 4,745,580 | 5/1988 | Laymoun et al. | 365/179 |
| 4,809,051 | 2/1989 | Kogan | 365/183 |
| 4,809,052 | 2/1989 | Nislioka et al. | 365/149 |

FOREIGN PATENT DOCUMENTS 62-31154 12/1987 Japan .

OTHER PUBLICATIONS

IBM Tech. Discl. Bull., vol. 18, No. 10, Mar. 1976, pp. 3250–3251, "Array Row Driver NPN Transistor", by Battista et al.

Primary Examiner—Stuart N. Hecker
Assistant Examiner—Alfonso Garcia
Attorney, Agent, or Firm—Antonelli, Terry, Stout & Kraus

[57] ABSTRACT

There is implemented memory cells and corresponding signal lines associated therewith in bipolar type static random access memories employing wirings of multi-layer construction for transmitting a common signal therethrough such as with respect to the individual word lines. The word lines implemented are formed from at least a pair of stacked conductive layers of a material whose principal component is aluminum and which layers have interposed therebetween an insulating film. The pair of layers form a pair of wiring lines corresponding together to a word line and wherein the wiring lines are, furthermore, interconnected at predetermined intervals along the lengths thereof. This leads to the ability to decrease the chip size of semiconductor integrated circuits noting that a decrease in the voltage drop of a signal line results, and to prevent electromigration in the signal (wiring) lines.

22 Claims, 8 Drawing Sheets

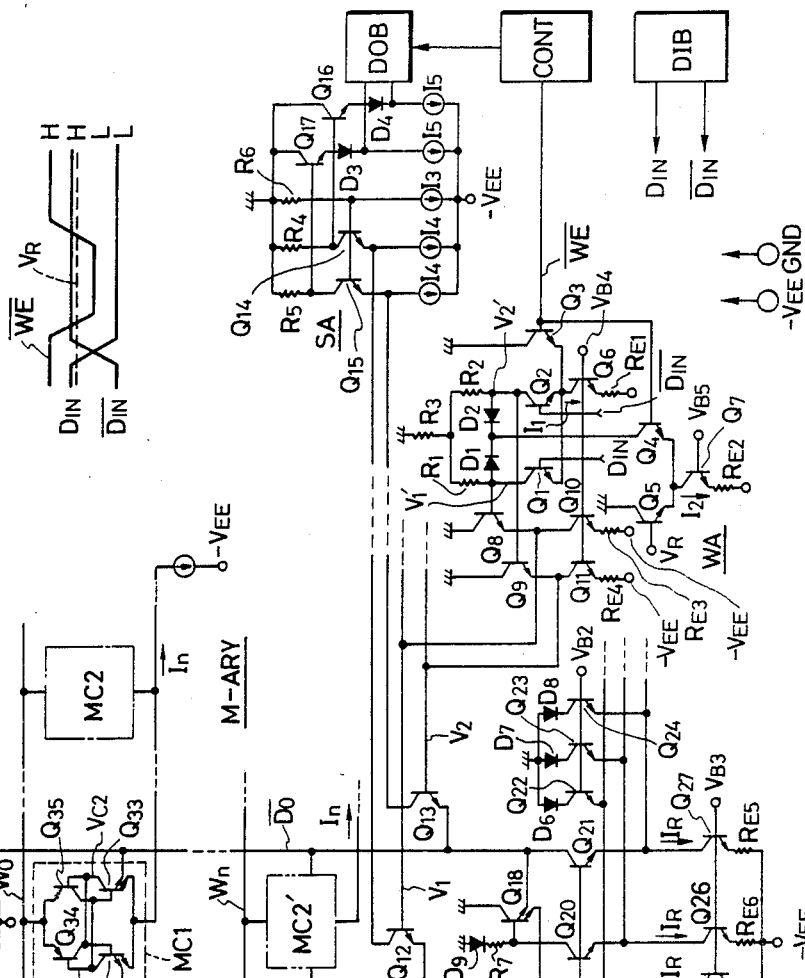
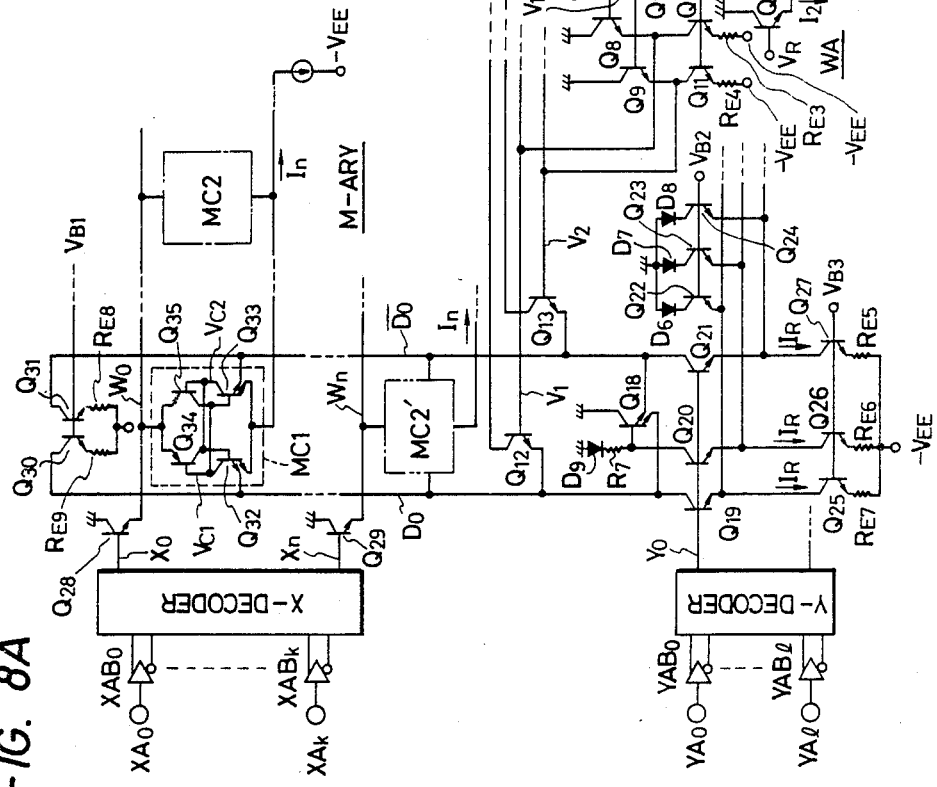
FIG. 8B
FIG. 8A

BIPOLAR STATIC RAM HAVING TWO WIRING LINES FOR EACH WORD LINE

BACKGROUND OF THE INVENTION

1. Technical field of the invention

This invention relates to a semiconductor memory, and particularly to an effective technique to be applied to a formation of a memory cell and a signal line in bipolar static random access memories.

2. Description of the prior art

In previous bipolar static random access memories, the aluminum two-layer wiring technique was applied: in this case, the first aluminium layer formed the digit lines (or data lines) of the memory array, and the second layer formed the word lines and holding current lines that crossed with the digit lines at right angles (Japan patent application No. 60-169808 published as document No. 62-31154).

SUMMARY OF THE INVENTION

However, as the manufacturing dimensions of semiconductor devices are becoming smaller and smaller with the development of lithography, dimesioning of the memory array is apt to be determined with the requirements in implementing a layout arrangement of the aluminium wiring. That is, in static random access memories (RAM), a current flowing through the word line or current keeping line is determined by the access velocity and so on, but when the current is increased to attain a desired access velocity, wiring resistances of the word line, etc., will increase the potential drop, or the electromigration will be easy to occur. Therefore, even if an area occupied by a memory cell can be decreased with the decreased of the capacitor area when the technology of manufacturing a miniaturized element or the U-groove isolation is applied, or the electrode construction is improved, a wiring width of the word line etc. cannot be made too small; thus, a decrease of the dimension of memory arrays and therefore memory cells becomes difficult because the aluminum wiring cannot be too wide.

The tendency for further miniaturization will be strong in the future because of memories having a large bit storage capacity.

When the memory bit storage capacity in semiconductor chips is increased, a long word-line, etc., will be needed for wiring, and the potential drop will be larger and larger, so it is feared that the operation margin of the memory cell would decrease or the read-out velocity would be different between that of the first cell and the last one.

An object of the present invention is to decrease the chip size in large-scale semiconductor integrated circuits.

Another object of the invention is to decrease the potential drop resulting from the wirings in the large-scale semiconductor integrated circuit, and to prevent the electromigration.

The other objects and new characteristics of the invention will be clear with the descriptions of the specification and the attached drawings.

The following relates to improved aspects of the present invention: for example, wirings relating to the same signal are implemented by employing at least two layers on the semiconductor region where circuit elements are arranged in high density, and this is the case for a word line on the bipolar static RAM.

By using the above means, the wiring cross section can be decreased without narrowing the wiring width, and an area occupied by the circuit is not restricted by the width of aluminum wirings so that the above object is attained, that is, a chip size can be decreased in large-scale semiconductor integrated circuits.

BRIEF DESCRIPTION OF THE DRAWINGS

FIG. 8A, FIG. 8B and FIG. 8C illustrate the circuit and timing for explaining operations of the typical and conventional, bipolar static RAM.

DESCRIPTION OF THE PREFERRED EMBODIMENTS

Operation explanation of the typical, bipolar static RAM

Figure 8C:
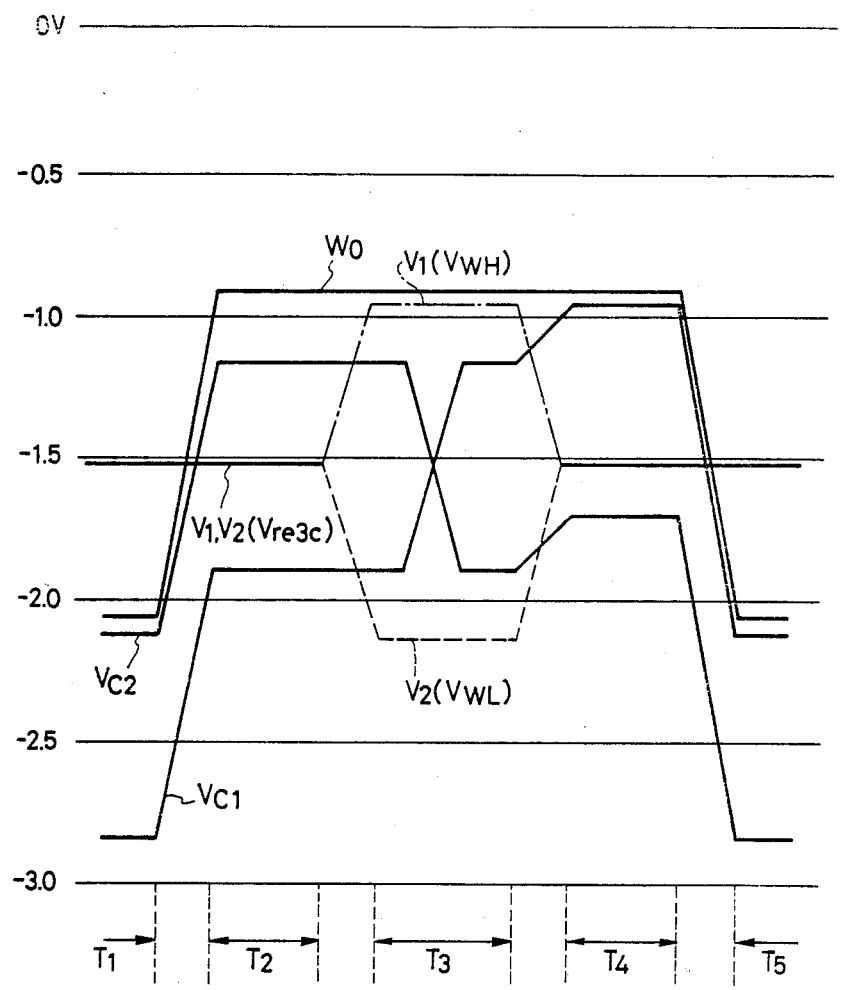

Before describing the embodiments of the present invention, the operation of a typical, bipolar static RAM circuit shall be explained referring to FIGS. 8A, 8B and 8C. The bipolar static RAM illustrated in FIG. 8A is formed on a semiconductor substrate by using known semiconductor integrated circuit technology. External terminals are provided in conjunction with signals associated with $XA_O$ to $XA_K$, from $YA_O$ to YA1, $D_{OUT}$, $D_{IN}$, $\overline{CS}$, $\overline{WE}$, $-V_{EE}$, and GND.

As for the memory cells, one of which MC1 is shown in terms of a specific circuit, which includes a flip flop circuit arrangement the circuit is constructed with npn driving transistors $Q_{32}$ and $Q_{33}$ having the base-collector cross connections for each other, and with pnp transistors $Q_{34}$ and $Q_{35}$ that are connected to each collector of the npn transistors and which are cross-connected to each other. The driving transistors $Q_{32}$ and $Q_{33}$ have no other restriction other than being of multi-emitter construction, and wherein each one of the emitters is commonly connected to the constant voltage source $-V_{EE}$ that supplies hold current In. The other emitters of the above transistors $Q_{32}$ and $Q_{33}$ are connected respectively to a pair of data (digit) lines $D_O$ and $\overline{D_O}$. And the commonly connected emitters of transistors $Q_{34}$ and $Q_{35}$ are connected to word line $W_O$.

In accordance with the above mentioned memory cell MC1, similar ones, for example 64 memories, are arranged in each of the rows and commonly connected to the same word line $W_O$; in FIG. 8A, one memory cell in the same row is shown as a black box. And in the vertical lines, similar memory cells, for example, 64 in number are connected in common to a column of complementary data lines $D_O$ and $\overline{D_O}$; in the figure, one cell in the same column is also shown as a black box. Such 64×64 memory cells are arranged as a matrix which forms a memory array M-ARY.

Representative word lines such as $W_O$ and $W_n$ shown in FIG. 8A can be selected by using word line driving transistors $Q_{28}$ and $Q_{29}$ that receive X address decoding signals $X_O$ and $X_n$. The signals are formed by an X address decoder.

An address signal supplied from a circuit device, not shown in the figure, is input to address buffer $XAB_O$ or $XAB_K$ through address input terminal $XA_O$ or $XA_K$. The address buffer $XAB_O$ or $XAB_K$ forms a complementary signal including an inverting and a non-inverting address signal according to the input address signal and supplies it to the X address decoder. Therefore, a word line is selected in accordance with the binary state of the applied address signals at the inputs of address buffers $XAB_O$ through $XAB_K$.

A pair of complementary data lines $D_O$ and $\overline{D_O}$ are connected to a constant current source $I_R$ which is used commonly for all data lines, through transistors $Q_{19}$ and $Q_{21}$ which are used as column switches. The current source $I_R$ is constructed with transistors $Q_{25}$ and $Q_{27}$ having emitter resistances $R_{E7}$ and $R_{E5}$, and a constant voltage $V_{B3}$ which is applied to the base of the transistor.

The bases of the transistors $Q_{19}$ and $Q_{21}$ are coupled to receive a decoded signal $Y_O$ that is formed by Y decoder.

An address signal supplied from the above mentioned circuit device, not shown in the figure, is input to address buffer $YAB_O$ or $YAB_l$ through address input terminal $YA_O$ or $YA_l$, respectively. The address buffer $YAB_O$ or $YAB_l$ forms a complementary signal including an inverting and a non-inverting address signal and transmits it to the Y decoder in accordance with the binary state of the input address signal at the inputs of address buffers $YAB_O$ to $YAB_l$. This selects a pair of data lines.

In this embodiment, the following circuit is used for providing a bias voltage to the data lines not being selected.

A serial connection of a diode $D_9$ and a resistor $R_7$ is connected between the base and the collector of a multi-emitter transistor $Q_{18}$, and in this case, the collector is grounded. The serial connection of the diode $D_9$ and the resistor $R_7$ is also connected to the same, constant current source $I_R$ through a similarly connected and biased transistor $Q_{20}$ as the above mentioned column switch transistors. The emitters of the transistor $Q_{18}$ are connected to a pair of data lines $D_O$ and $\overline{D_O}$, respectively.

Therefore, the transistor $Q_{18}$ can be constructed either as a multi-emitter transistor or as two transistors, the bases or the collectors of which are connected are in common, respectively.

The pair of the data lines have a constant minute-current source. That is, a minute current is always sunk into transistors $Q_{30}$ and $Q_{31}$ that commonly receive a constant voltage $V_{B1}$ at the bases thereof and which have emitter resistances $R_{E9}$ and $R_{E8}$. Thus, a potential of the non-selected data lines is biased with a voltage that is formed by summation of the forward voltage $V_F$ of diode $D_9$ and the base-emitter voltage $V_{BE}$ of the transistor $Q_{18}$.

The constant current source $I_R$ has transistors $Q_{22}$, $Q_{23}$ and $Q_{24}$, each of which has the base supplied with a bias voltage $V_{B2}$. The voltage $V_{B2}$ is selected to be a little lower than the selection level of the Y address decoding signal.

Therefore, if a decoding signal $Y_O$ is less than the above voltage $V_{B2}$ when, for example, the data lines are switched from a selection from that of data lines $D_O$, $\overline{D_O}$ to data lines $D_1$, $\overline{D_1}$ by the switching action of the column switch, transistors from $Q_{19}$ to $Q_{21}$ are turned off and transistors $Q_{22}$ to $Q_{24}$ are turned on. This, at first, causes a current $I_R$ flowing through the data lines $D_O$ and $\overline{D_O}$ to be cut off, and nextly, the transistors from $Q_{22}$ to $Q_{23}$ to turn off when a decoding signal $Y_1$ becomes larger than the voltage $V_{B2}$, wherein a column switch transistor (not shown in the figure) which is connected to the data lines $D_1$ and $\overline{D_1}$ and is responsive to signal $Y_1$ is turned on.

In this way, the constant current $I_R$ is prevented from flowing in both of the data lines with a current distributing ratio depending on the address decoding a signal level.

For the purpose of writing into and reading from the memory cell, a pair of the data lines $D_O$ and $\overline{D_O}$ have current switching transistors $Q_{12}$ and $Q_{13}$, the emitters of which are connected to the data lines.

A collector output signal of these transistors $Q_{12}$ and $Q_{13}$ is transmitted to an input of a sensing amplifier SA.

The sensing amplifier SA comprises the following circuit elements.

A constant current source $I_4$ is connected to each emitter of transistors $Q_{14}$ and $Q_{15}$, which receive a constant voltage $-I_3R_6$; in this case the voltage is generated from a resistor $R_6$ wherein a constant current $I_3$ is flowing therethrough. Each collector associated with transistors $Q_{14}$ and $Q_{15}$ is connected to resistors $R_4$ and $R_5$, respectively.

Each collector of the transistors $Q_{12}$ and $Q_{13}$ is connected to the emitter of the transistors $Q_{15}$ and $Q_{14}$, respectively. The collector output of the transistors $Q_{14}$ and $Q_{15}$ is transmitted to the base of transistors $Q_{16}$ and $Q_{17}$, respectively, wherein the emitters of which are coupled to data output buffer (DOB) and via which diodes $D_4$ and $D_3$, provided for level shifting, respectively, are coupled to a constant current source $I_5$ forming a pair of series connections between the emitters of $Q_{16}$ and $Q_{17}$ and supply-$V_{EE}$.

The constant currents $I_3$ and $I_4$, and the resistors from $R_4$ to $R_6$ are set in such a way that an output level through the diodes $D_3$ and $D_4$ will be the same as the input level of a data output buffer which is constructed with ECL circuits.

The bases of the transistors $Q_{12}$ and $Q_{13}$ are biased with output voltages $V_1$ and $V_2$ of a writing circuit WA.

The writing circuit WA is constructed with the following circuit elements as shown in FIG. 8A.

The emitters of transistors $Q_1$, $Q_2$ and $Q_3$ are, in common, connected to a constant current source $I_1$. The current source $I_1$ is effected by with a transistor $Q_6$, the base of which is biased with a constant voltage $V_{B4}$, and an emitter resistance $R_{E1}$ thereof.

Each collector of the transistors $Q_1$ and $Q_2$ is connected to one end of resistors $R_1$ and $R_2$. The values of the resistors $R_1$ and $R_2$ are set to be equal, the other ends thereof are connected in common, and are connected to one end of a resistor $R_3$ the other end of which is connected to the ground potential (0 volt). The anodes of diodes $D_1$ and $D_2$ are connected to the collectors of the transistors $Q_1$ and $Q_2$, respectively. The cathodes of the diodes $D_1$ and $D_2$ are commonly connected to the collector of a transistor $Q_4$.

The bases of the transistors $Q_1$ and $Q_2$ are coupled to receive an inverting and a non-inverting, writing data signals $D_{IN}$ and $\overline{D_{IN}}$ formed by a data input buffer DIB that receives a writing data signal; in this case, the signal is supplied from a terminal $D_{IN}$.

The collector of the transistor $Q_3$ is connected to the ground potential, and its base is biased with a control signal $\overline{WE}$ for reading and writing, which is generated by a control circuit in receiving control signals from terminals $\overline{CS}$ and $\overline{WE}$. The signal $\overline{WE}$ is also inputted to the base of a transistor $Q_4$. The collector of a transistor $Q_5$, which transistor is differentially connected to the transistor $Q_4$, is connected to the ground potential and its base is biased with a reference voltage $V_R$.

The commonly connected emitters of the transistors $Q_4$ and $Q_5$ are connected with a transistor $Q_7$ that receives a constant voltage $V_{B5}$ and has an emitter coupled to resistance $R_{E2}$ so as to provide a constant current source $I_2$.

A collector output of the transistor $Q_1$ is transmitted to the emitter-follower circuit comprising a transistor $Q_8$ and a constant current source, which is constructed with a transistor $Q_{10}$ and an emitter resistance $R_{E3}$ and connected to the emitter of the transistor $Q_8$. The output voltage of the emitter follower will be the reference voltage $V_1$, which is added to the base of a current switching transistor, for example the transistor $Q_{12}$ that can be connected to one of the data lines.

A collector output of the transistor $Q_2$, on the other hand, is transmitted to the emitter follower circuit comprising a transistor $Q_9$ and a constant current source, which is constructed with a transistor $Q_{11}$ and an emitter resistance $R_{E4}$ and connected to the emitter of the transistor $Q_9$. The output voltage of the emitter follower will be the reference voltage $V_2$, which is added to the base of a current switching transistor, for example the transistor $Q_{13}$ that can be connected to the other of the above mentioned data lines.

Signals $\overline{WE}$, $D_{IN}$ and $\overline{D_{IN}}$ and the reference voltage $V_R$ of the writing circuit WA are being set as shown in FIG. 8B. According to the signals $\overline{WE}$, $D_{IN}$ and $\overline{D_{IN}}$, each of output voltages $V_1$ and $V_2$ of the writing circuit WA forms levels of three values.

FIG. 8C is a timing diagram illustrating an example of the operation of the above mentioned ECL circuit.

Except for the writing operation, the control signal $\overline{WE}$ has a high level H that is set higher than the high level H of the writing data signals $D_{IN}$ and $\overline{D_{IN}}$, so the transistors $Q_3$ and $Q_4$ of the writing circuit WA are being turned on. Therefore, as constant current $I_2$ flows through diodes $D_1$ and $D_2$ through the resistors $R_1$ and $R_2$, dividing the current equally therethrough and as the constant current flows through the resistor $R_3$, a collector voltage of the transistors $Q_1$ and $Q_2$ is obtained from the following expression (4).

$$V1' = V2' = Vrefc' = -I2(R3 + R1/2) \tag{4}$$

Now, from the above description, $R_1$ is equal to $R_2$, and the level of the voltage is shifted by the base-emitter voltage of the transistors $Q_8$ and $Q_9$, so a reference voltage Vrefc is generated as shown in FIG. 8C.

When the memory cell is not selected (X and Y are not selected), namely at the interval $T_1$, an electric potential of the word line $W_O$ or $W_n$ is set less than the voltage Vrefc so that the column switch is off. Therefore, for example, the potential on the data lines $D_O$ and $\overline{D_O}$ is approximately $-2 V_{BE}$ ($V_F + V_{BE}$) so that the transistors $Q_{12}$ and $Q_{13}$ are turned off, too. As for each memory cell, for example a represented one, not only a low level $V_{C1}$ is held by a transistor $Q_{32}$ being turned on, but a high level $V_{C2}$ is held by a turning off of a transistor $Q_{33}$.

When the memory cell is selected (X and Y are selected), namely during time interval $T_2$, a word line $W_O$ will be at a high level higher than the reference voltage Vrefc. The column switch transistors $Q_{19}$ to $Q_{21}$ are turned on, so a constant current $I_R$ flows through one of the date lines $D_O$ and $\overline{D_O}$.

As the constant current $I_R$ also flows through a resistor $R_7$, the base potential of transistor $Q_{18}$ becomes less than the reference voltage Vrefc; thus, the transistor $Q_{18}$ is turned off. And with a potential increase of the word line $W_O$, the hold voltage $V_{C1}$, $V_{C2}$ of the memory cell rises, so the reference voltage Vrefc will have a value between them.

In this condition, a reading operation takes place for the memory cell selected. That is, in the above relationship of the electric potentials, the transistor $Q_{12}$ is off, and the transistor $Q_{13}$ is on. Therefore, the constant current $I_R$ flowing through the transistor $Q_{13}$ is supplied to a resistor $R_5$ through the transistor $Q_{15}$, so the collector potential of the transistor $Q_{15}$ decreases and it is transmitted to the data output buffer DOB as a low level signal. However, the constant current $I_R$ cannot flow through the transistor $Q_{12}$ that is turned off, so the output of this transistor is transmitted to the data output buffer as a high-level signal.

In this way, both of the selection and the reading of the memory cell are operated automatically.

Since the output operating condition of the data output buffer DOB is controlled by using a signal coming from a control circuit CONT, the data contained in it are not always transmitted to the output terminal $D_{OUT}$ as they are, only by the above mentioned selection of the memory cell.

When the memory cell is in the inverted writing phase during timing interval $T_3$, the control signal $\overline{WE}$ has a low level as shown in FIG. 8B. Therefore, the transistors $Q_3$ and $Q_4$ of the writing circuit WA are turned off, and the transistor $Q_5$ is on. Since the procedure is an inverted writing condition wherein a writing data signal $\overline{D_{IN}}$ has a high level H the transistor $Q_2$ is turned on.

By turning on the transistor $Q_2$, a constant current $I_1$ flows into the resistors $R_2$ and $R_3$. In this way, the collector voltage $V_2'$ of the transistor $Q_2$ is obtained from the following expression (5).

$$V2' = -I1(R2 + R3) \tag{5}$$

And the collector voltage $V_1'$ of the transistor $Q_1$ that is turned off, is obtained from the following expression (6).

$$V1' = -I1R3 \tag{6}$$

The voltage level $V_2'$ is shifted by the base-emitter voltage of the transistor $Q_9$, and, as shown with the broken lines in FIG. 8C, forming a low level writing voltage $V_{WL}$ that is less than the low level holding voltage $V_{C1}$.

The level of the voltage $V_1'$ is shifted, too, and forms a high level writing voltage $V_{WE}$ that is higher than the high level holding voltage $V_{C2}$.

The transistor $Q_{13}$ which receives the low level writing voltage $V_{WL}$ ($V_2$) is turned off, because its base voltage $V_{WL}$ is less than the base voltage $V_{C1}$ of a transistor $Q_{33}$ that has a differential configuration connected to the data line $\overline{D_O}$. Therefore, the transistor $Q_{13}$ causes the constant current $I_R$ to flow into the transistor $Q_{33}$ thereby switching transistor $Q_{33}$ from off to on.

As for the transistor $Q_{12}$ that receives the high level writing voltage $V_{WH}$ ($V_1$), its base voltage $V_{WH}$ is higher than the base voltage $V_{C2}$ of a transistor $Q_{32}$ that has a differential configuration connected to the data line $D_O$. Therefore, the transistor $Q_{12}$ is turned on so as to cut off an emitter current of the transistor $Q_{32}$ thereby switching the transistor $Q_{32}$ from on to off. Then, the holding voltages $V_{C1}$ and $V_{C2}$ are inverted wherein it is indicative of the inverted writing state condition.

In such a three-value system, the driving transistors $Q_{32}$ and $Q_{33}$ of the memory cell are directly switched on or off at the same time, and therefore a high speed writing operation can be executed.

In a half holding period $T_4$ for X selection and Y non-selection, the constant current $I_R$ is cut off from flowing through the memory cell, and a bias voltage across the transistor $Q_{18}$ is applied to the data lines $D_O$ and $\overline{D_O}$, and therefore the holding voltages $V_{C1}$ and $V_{C2}$ are shifted upwardly toward the high level.

In another half selection period $T_5$ for X non-selection and Y selection, the work line $W_O$ has a low level, so the holding voltages $V_{C1}$ and $V_{C2}$ are shifted to the low level, as is the same for the non-selected period $T_1$.

The above corresponds to a brief description of the operation of the typical bipolar static RAM. The inventors have investigated the results in conjuction with high speed operation and high integration of such random access memories, and, as a result of which, they have found the following problems, associated with such SRAM3.

1. In bipolar static random access memories, an access speed etc. will determine a current level that should flow into a word line (for example $W_O$) or a line for the holding current (for example In), which are made of aluminum. However, when the current is increased in order to attain a high access speed, a potential drop associated with the word line becomes large owing to the wiring resistance of the line, or the electro-migration is easy to occur.

As a result thereof, a wiring width of the word line and so on cannot be too small and therefore the aluminum wiring width is a barrier that makes it difficult to decrease the area or dimensions of memory cells. That is, there is a tendency for increasing the width of the aluminum wirings associated with such lines.

2. When the capacity of memory cells increases, a wiring length of the word line etc. becomes larger and larger; therefore, there results in a corresponding increase in the amounts of a potential drop of the word line. This leads to the problems that the operation margin of the memory cell becomes low, or the reading speed differs between the first memory cell (for example MC1) connected to the word line (for example $W_O$) and the last cell.

The present invention intends to solve the above problems, and nextly the embodiments of the invention will be described according to the attached drawings.

EMBODIMENTS

Embodiment 1

Figure 1:
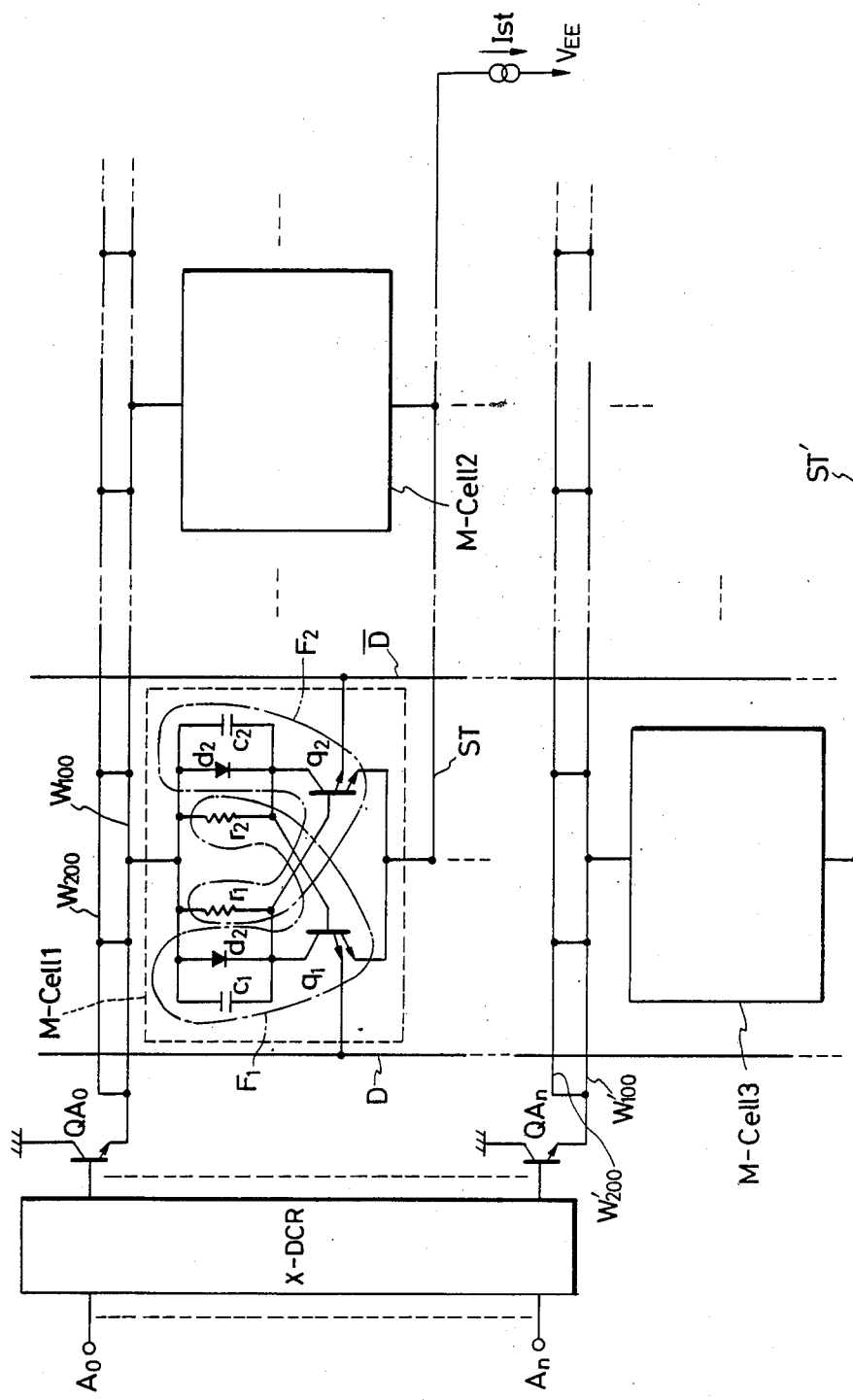
FIG. 1 is an equivalent circuit of a static RAM consisting of emitter-coupled memory cells according to the first embodiment of the present invention.

FIG. 1 is an equivalent circuit of a static RAM comprising emitter coupled memory cells according to the first embodiment of the invention. A memory cell of the figure M-Cell 1 consists of Schottky barrier diodes d1, d2; capacitors C1, C2, each of which is connected in parallel to one of the Schottky barrier diodes d1, d2; multi-emitter transistors q1, q2, the collectors of which are connected in series with the Schottky barrier diodes d1, d2 and the capacitors C1, C2; and load resistances r1, r2, each of which is connected in parallel with the Schottky barrier diodes d1, d2 and connected in series with each base of the multi-emitter transistors q1, q2. That is, information stored in the memory cell M-Cell1 is held by using the flip-flop circuit comprising the above mentioned elements, q1, q2, r1, r2, d1, d2, c1 and c2. The information of the memory cell M-Cell1 is being held with a current $I_{ST}$ that flows through a holding current line ST. The memory cell M-Cell1 is connected with the signal lines (for example word line W100, data line D,$\overline{D}$ etc.). The word line of the memory cells in each row such as memory cell M-Cell1, for example, has a double construction (for example, W100 and W200 are connected in parallel). Such memory cells as the M-Cell1, M-Cell2, etc. are arranged along the word lines (W100, W200, etc.), constructing a memory line or a row of memory cells, and a plurality of such memory lines are arranged in the direction of data lines (D,$\overline{D}$), forming a plurality of columns of memory cells, each column associated with a pair of complementary data lines (D,$\overline{D}$) thereby constructing a memory array of matrix type.

When the memory cell M-Cell1 is selected, the word line W100 connected to a transistor QAO is selected by an external signal that is entered into input terminals AO, —,An of a row address decoder X-DCR; and the data lines D,$\overline{D}$ are selected by a column address decoder (not shown in the figure).

A static RAM comprising the above mentioned emitter-coupled memory cells has double signal lines (word lines) associated with memory line or row, so the electromigration cannot occur even if a large reading current (for example 10 mA), when the information is read out, flows through the signal line in order to increase an access speed of the RAM. Furthermore, a potential drop across the ends of signal lines due to the wiring resistance of signal lines (word lines) can be half or less compared with the wiring resistance in the case of a single signal line (word line).

Embodiment 2

Figure 2:
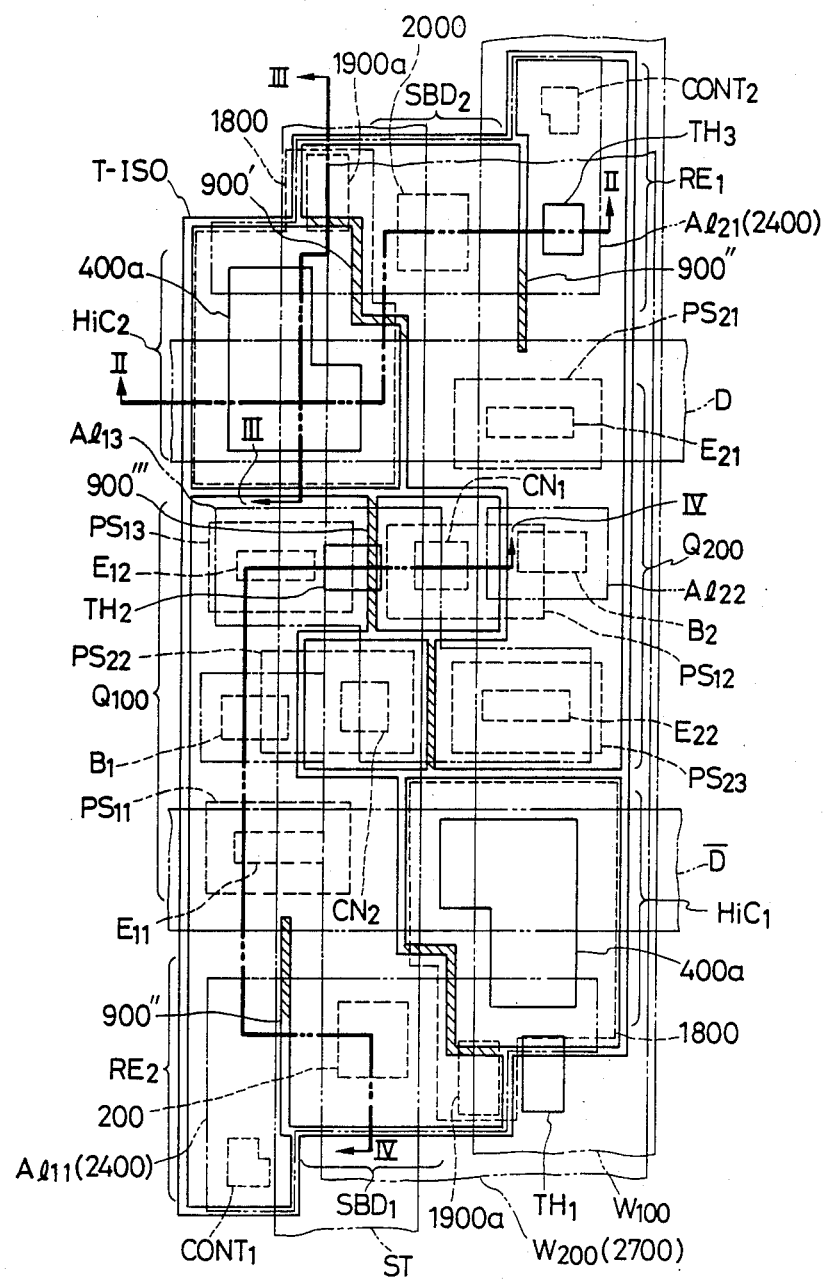
FIG. 2 shows a layout of the emitter-coupled memory cells and signal lines according to the second embodiment of the invention.

FIG. 2 shows a static RAM memory cell comprising an emitter-coupled memory cell and a layout of the signal lines (word line, data line, etc.), where, in the same way as the case of FIG. 1, Schottky barrier diodes and capacitors are connected in parallel with load resistances).

Such memory cells as those having a layout shown in FIG. 2 are densely arranged in such a way that they come face to face with the adjacent, upper and lower memory cells, then a memory line is constructed along the word lines W100 and W200. A plurality of such memory lines, when they are arranged in the horizontal direction, form a memory array of matrix type.

In FIG. 2, the alphanumerics SBD1 and SBD2 show regions formed by the Schottky barrier diodes d1 and d2, adjacent to which there are provided regions formed by resistors r2 and r1, respectively. In this embodiment, the first aluminum layer $Al_{11}$ (2400) is formed on the diode-formed region SBD1 (SBD2), and is extended on a resistor-formed region RE2 (RE1); and then the aluminum layer is connected to a P-diffusion layer 3400 (refer to FIG. 5) of the semiconductor surface at contact holes CONT1 and CONT2. This makes it possible to contact an anode terminal of the Schottky barrier diode d1 (d2) to a terminal of the resistor r2 (r1). The aluminum layer $Al_{11}$ (2400) can be not only of Al-Si(2%) alloy but of Al-Si(2%)-Cu(3%) alloy.

Regions Q100 and Q200 forming transistors q1 and q2 are provided in approximately rectangular shape continuing to the diode-forming regions SBD1 and SBD2 and to the resistor-forming regions RE2 and RE1. On adjacent portions of the transistor-forming regions Q100 and Q200 to the resistor-forming regions RE2 and RE1, emitter regions E11 and E21 are formed, on which are provided polysilicon layers PS11 and PS21, respectively.

On the other ends of the transistor-forming regions Q100 and Q200, collector drawing regions CN1 and CN2 are arranged, respectively. And adjacent to the collector drawing regions CN1 and CN2, base-contact holes B2 and B1 are arranged, respectively, in the opposite-side transistor-forming regions Q200 and Q100. The collector drawing regions CN1 and CN2 although not particularly limited thereto, are connected through the polysilicon layers PS12 and PS22 to the base drawing electrodes $Al_{22}$ and $Al_{12}$ that are formed on the base contact holes B2 and B1. In this way, the transistors q1 and q2 will have a cross coupling between their bases and collectors. The base drawing electrodes $Al_{12}$ and $Al_{22}$ are formed by the first aluminum layer.

A second emitter region E12 (E22) is provided between the collector drawing region CN1 (CN2) and the base contact hole B1 (B2). On the emitter regions E12 and E22, polysilicon layers PS13 and PS23 are formed, respectively. The polysilicon layers PS13 and PS23 are connected with each other by the first aluminum layer $Al_{13}$.

A capacitor-forming region HiC1 (HiC2) is provided on the opposite side of the resistor-forming region RE2 (RE1), accross the diode-forming region SBD1 (SBD2) and adjacent to the emitter region E11 (E21). An electrode layer 1800 of the capacitor that is so formed as to cover the capacitor-forming region HiC1 (HiC2) is extended toward the outside of the cell, namely, toward the side of the diode-forming region SBD1 (SBD2). Then, the aluminum layers $Al_{11}$ and $Al_{21}$ (2400) are formed to cover the resistor-forming regions RE2, RE1 and the diode-forming regions SBD1, SBD2, and extended to the sides of the capacitor-forming regions HiC1, HiC2 so as to fall on the electrode layer 1800; the aluminum layer 2400 and the electrode layer are connected with each other through an opening 1900a.

On the capacitor-forming region HiC1 (HiC2) and the adjacent emitter region E11 (E21), a digit wire D ($\bar{D}$) of the first aluminum layer is laid and connected to the polysilicon layer PS11 (PS21).

Moreover, on the memory cell that is formed, as according to the above mentioned layout, there are arranged the word line W100 formed of the second aluminum layer at right angles with the digit lines D and $\bar{D}$, and a holding current line where a current is flown to keep the information of the memory cell at any time (it is called stand-by current, too).

The word line W100 is connected to the aluminum layer $Al_{11}$ ($Al_{21}$) used as an anode terminal of the Schottky barrier diode d1 (d2) at the position of a through hole TH1. The aluminum layer $Al_{21}$ is formed in one body with the aluminum layer $Al_{11}$ of the Schottky barrier diode d1 accommodated in the adjacent memory cell, and then connected to the word line W100.

The holding current line ST is, on the contrary, connected to an aluminum layer $Al_{13}$ for connecting the second emitters E12 and E22 in common at a through hole TH2, and the stand-by current flows through one of the emitters E12 and E22. Each wiring width of the word line W100 and the holding current line ST is for example, 7 μm or so.

In, this embodiment, a reinforced word line W200 is laid on the word line W100, forming the third aluminum layer. The reinforced word line W200 is formed wider, for example 14 μm, than the word line W100 of the second aluminum layer, and the word lines W100, and W200 are connected with each other at the effective through hole TH3. Therefore, a wiring resistance and corresponding potential drop will be decreased compared with a word line that is formed only with the second aluminum layer. And by adding the word line W200 that is formed with the third aluminum layer, the width of the second aluminum layer W100 can be made smaller than in case without having the third layer. Therefore, an area occupied by the memory cell can be of a minimum required value that is determined by the manufacturing dimensions and characteristics of elements.

In this way, the word line has a double-layer construction of aluminum, and the layers of each memory cell are connected with each other at one position by using the through hole TH3; therefore, even if one of the wirings breaks along its path, the operation of the associated memory cells can still be maintained by the remaining wiring word line. The second and third aluminum wirings can be formed with layers of Al-Si(2%) alloy or Al-Cu(3%)-Si(2%) alloy.

The periphery of such a memory cell and boundaries of the symmetrical elements have a deep trench isolation region T-ISO (or U-groove isolation region) formed in such a way as to pass through the N+ embedding layer, so an isolation is made between the elements. And a shallow isolation region 900' (shown by hatching in FIG. 2) is formed on the boundary between the diode-forming region SBD1 (SBD2) and the capacitor-forming region HiC1 (HiC2). Referring to FIG. 1, the elements encircled with dotted, chained lines F1 and F2 are separated from one another by using the trench isolation region T-ISO.

Figure 3:
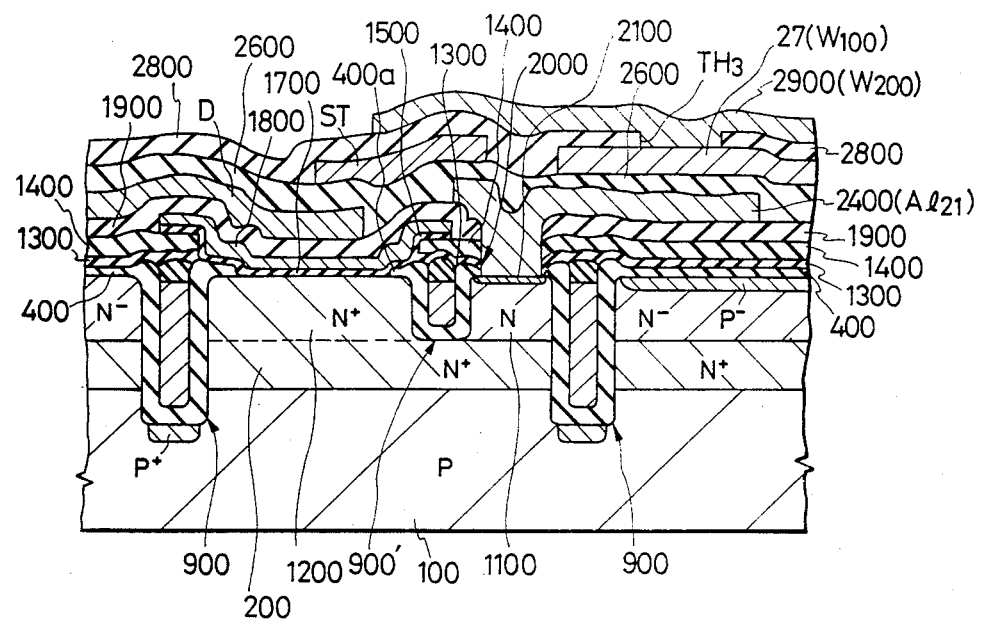
FIG. 3 is a cross sectional view by line II —II of FIG. 2.

FIG. 3 shows a cross section cut along the line II—II of FIG. 2, that is, an example of the cross sectional construction of the Schottky barrier diode and capacitor, which are connected in parallel with the load resistor.

As shown in FIG. 3, such a semiconductor substrate 100 as made of P-type single-crystal silicon has an N+ embedding layer 200 of high density, which is formed on the substrate with its periphery encircled by such a separating region 900 as the trench isolation region. An N-type semiconductor region 1100 of low density and an N+-type semiconductor region 1200 of high density are formed, respectively, on the N+ embedding layer 200; and between the N-type region 1100 and the N+-type region 1200, a shallow trench isolation region 900' is formed, having a depth to touch the N+ embedding layer 200 so that both of the semiconductor regions 1100 and 1200 are separated.

An opening 400a is formed through a film of silicon oxide 400 that is laid on the surface of the semiconductor substrate 100, and an opening 1500 is formed through isolation films 1300 and 1400 that are laid on the film 400; in this case, the openings are so formed as to correspond, respectively, to the N+-type semiconductor region 1200 of high density. From the inside of the opening 1500 to its periphery is formed an isolation film 1700 of transition metal oxide, for example tantalum oxide ($Ta_2O_5$), having a high dielectric constant. On the isolation film 1700, an electrode layer 1800 is formed, comprising a metal of high melting point such as tungsten (W) or molybdenum (Mo), or comprising their silicon compounds (WSi, MoSi) and so on; thus, between the electrode layer 1800 and the N+-type semiconductor region 1200, a capacitor having a large dielectric capacity per unit area is formed.

In the meantime, a contact hole 2000 is formed through the isolation films 1300 and 1400 that are laid on the surface of the N-type semiconductor region 1100 of low density which is prepared on the N+ embedding layer 200. Then, on the surface of the semiconductor region 1100 that is formed inside the contact hole 2000, an electrode layer 2100 and an aluminum layer 2400 are formed by three-series metals, for example $PtAl_2Si$, that have a low barrier height $\phi$ B against silicon. The electrode layer 2100 can be made by reacting aluminum and platinum silicide: for example, a platinum silicide (PtSi) layer is formed at first on the surface of the semiconductor region 1100, secondary, the aluminum layer 2400 is vaporized, and then a sinterring (heat treatment about 500° C.) is done.

As described above, in this embodiment, an isolation film 1900 such as a PSG (phosphorus-silicate-glass) film is formed on the electrode layer 1800 of the portion of the capacitor (or on the isolation film 1400 outside the electrode layer 1800), and the opening 2000 is prepared through the isolation film 1900 corresponding to the electrode layer 2100. The aluminum layer 2400 for connection, is formed on the PSG film 1900; thus, the electrode layer 2100 of the Schottky barrier diode for the capacitor is connected at the opening 2000.

The second aluminum layer 2700 is prepared to form the word line W100 on the aluminum layer through a layer-to-layer isolation film 2600; moreover, the third aluminum layer 2900 is prepared to form the reinforced word line W200 on the aluminum layer 2700 through a layer-to-layer isolation film 2800.

In this embodiment, a capacitor having a different electrode construction and a Schottky barrier diode are formed on the N+ embedding layer 200 that is surrounded with the trench isolation region 900. Therefore, the capacitor and the Schottky barrier diode need not be formed separately so that the separation region can be used for another element to be integrated in high density.

Furthermore, the N+-type semiconductor region 1200 should be formed in such a way that, after being doped with an N-type impurity (phosphorus or arsenic), it is diffused by heat to a depth reaching N+ embedding layer 200. In this case, if there is no trench isolation region 900' between the semiconductor region 1200 where a capacitor is formed and the semiconductor region 1100 where a diode is formed, impurities are diffused along the horizontal direction, too. Therefore, an area of the semiconductor region on the N+ embedding layer 200 should be large enough to prevent the contact of the diode electrode layer and the N+-type semiconductor region 1200 of the capacitor. And then, a mating margin should be kept between a penetrating mask for N-type impurities and the mask that forms an opening of the N-type semiconductor region 1100. In this way, it requires a large area occupied by the forming regions for capacitors and diodes.

As for the embodiment of the invention, on the contrary, the N-type semiconductor region 1100 and the N+-type semiconductor region 1200 are now separated by a shallow trench isolation region 900' so that there is no diffusion of impurities along the horizontal direction, and therefore not only the area of the N+ semiconductor region 1200 can be decreased, but the mating margin of the mask need not be considered for penetrating the N-type impurities. In this way, the area of the N+-type embedding layer 200 and the upper semiconductor region, that is, the area occupied by the diode and the capacitor is greatly decreased; this makes a high integration possible.

Figure 4:
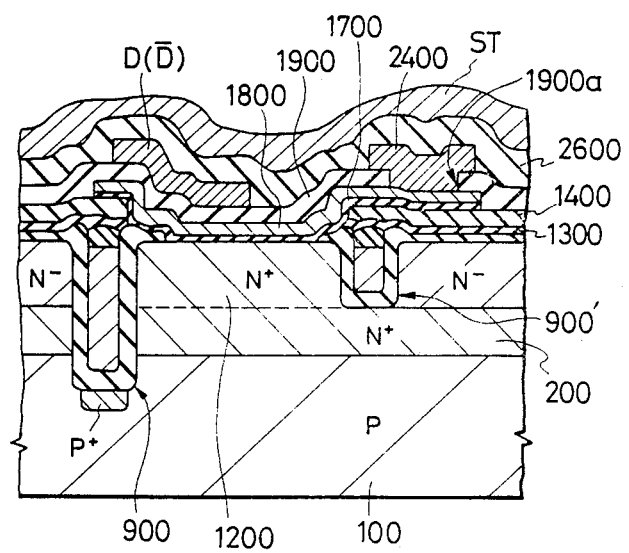
FIG. 4 is a cross sectional view by line III —III of FIG. 2.

FIG. 4 shows a cross sectional diagram cut along III—III of FIG. 2.

In the figure, the electrode layer 1800 of the capacitor is extended to the outside of N+-type semiconductor region 1200 (capacitor forming region HiC); the PSG film 1900 is formed on the electrode layer 1800; and the opening 1900a is formed corresponding to the extended part of the electrode, connecting to the aluminum layer 2400 that is extended from the diode. Therefore, if the metal of high melting point that constructs the electrode layer 1800 reacts with the aluminum layer 2400 which is vaporized on it, and is alloyed so that the aluminum layer 2400 passes through the electrode layer 1800, the reaction could not reach the surface of the .N+-type semiconductor region 1200, because the connection is made outside the capacitor. And the upper part of the electrode layer 1800 that is laid on the surface of the N+-type semiconductor region, is covered with the PSG film 1900. Therefore, the heat resistance of the capacitor is largely improved compared with that of the electrode layer 1800 and the aluminum layer 2400 which are to be connected on the semiconductor region 1200.

In this embodiment, the aluminum wiring layer, forming a digit line or a data line D ($\overline{D}$), is formed on the PSG film 1900 and over the N+-type semiconductor region 1200 which will form a capacitor. Thus, if the electrode layer 1800 of the capacitor is extended outside so as to effect contact with the aluminum layer 2400 as mentioned above, the area of the cell can never be increased, rather it is decreased.

In other words, the conventional emitter-coupled memory cell having a Schottky barrier diode, in general, has a comparatively large non-formed region under the digit lines D, $\overline{D}$, where any element is not formed yet. However, according to the embodiment of the present invention, a capacitor is aggressively formed under the digit line, so the connection with the aluminum layer is done outside. Therefore, an extra non-formed region can scarcely be generated, thus the cell area is decreased to make the high integration possible.

Figure 5:
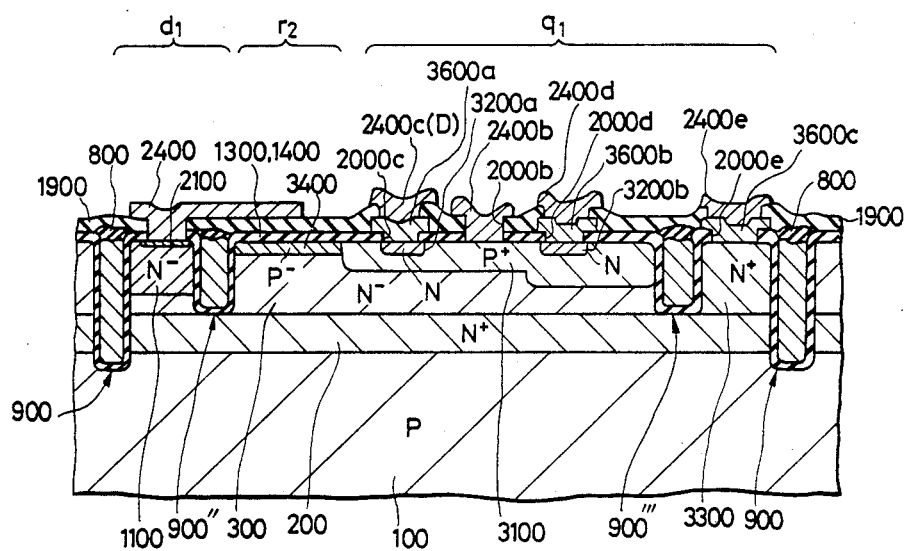
FIG. 5 is a cross sectional view by line IV —IV of FIG. 2.

FIG. 5 shows a cross section cut along the line IV—IV of FIG. 2. In the figure, the aluminum wirings of the second and third layers are omitted, and the films inserted between the layers are not shown except for the first aluminum layer.

In FIG. 5, numeral 3100 represents a P+-type semiconductor region that forms the base of the transistor q1 (or q2) of the memory cell shown in FIG. 1, alphanumerics 3200a and 3200b represent N+-type semiconductor regions forming the emitters of the transistor q1 (q2), and a numeral 3300 is an N+-type semiconductor region forming the collector lead-out region of the transistor q1 (q2).

In this embodiment, although there is no particular restriction, each $h_{FE}$ (direct current amplifying coefficient) has the optimum value by changing the base thickness just under the emitter regions 3200a and 3200b.

The N-type semiconductor region 1100 that forms a Schottky barrier diode d1 (or d2) is laid on the N+ embedding layer 200 that forms the collector region of the transistor q1 (q2); and between the N-type semiconductor region 1100 and the base region 3100, a shallow P−-type semiconductor region 3400 is formed to be a load resistance r2 (or r1). A trench isolation region 900 is provided between the semiconductor regions 1100 and 3400. It is clear from FIG. 2 that the trench isolation region 900 changes from a deep one to a shallow one (shown by the hatching) on its way. This changes the cross sectional area of the N+ embedding layer 200 that connects the semiconductor region 1100 and the collector region of the transistor q1, and adjusts a value of a resistor connected in parallel with the diode d1.

Moreover, in this embodiment, a shallow trench isolation region 900''' is formed, too, between the base region 3100 and the collector drawing tip 3300.

An aluminum layer 2400 is formed on the isolation films 1300, 1400 and 1900, all of which cover the surface of not only the N-type semiconductor region 1100 forming the Schottky barrier diode d1 (d2) but also the P−-type semiconductor region 3400 forming the load resistance; and the aluminum layer contacts with the electrode layer 2100 of the Schottky barrier diode at the position of contact hole 2000. And then, as an extended part of the aluminum layer 2400 is contacted with the P−-type semiconductor region 3400 at the position not shown in the figure, the anode terminal of the diode d1 (d2) is connected with one terminal of the resistor r2 (r1). Moreover, an aluminum electrode 2400b used for drawing the base, is formed inside of a contact hole 2000b that is provided through the isolation films 1300 and 1400 on the surface of the base region 3100.

And inside the contact holes 2000c, 2000d and 2000e that are formed on the isolation films 1300 and 1400 laid on the substrate, polysilicon electrodes 3600a, 3600b and 3600c are formed corresponding to the emitter electrodes 3200a, 3200b and the collector lead-out region 3300. Aluminum electrodes 2400c, 2400d and 2400e are formed on the polysilicon electrodes 3600a, 3600b and 3600c through an isolation film 1900.

In FIG. 4 and FIG. 5 that show the cross sections cut along the line III—III and the line IV—IV of FIG. 2, the isolation films 2600 and 2800 are not shown if they are formed above the first aluminum layer.

Embodiment 3

Figure 6:
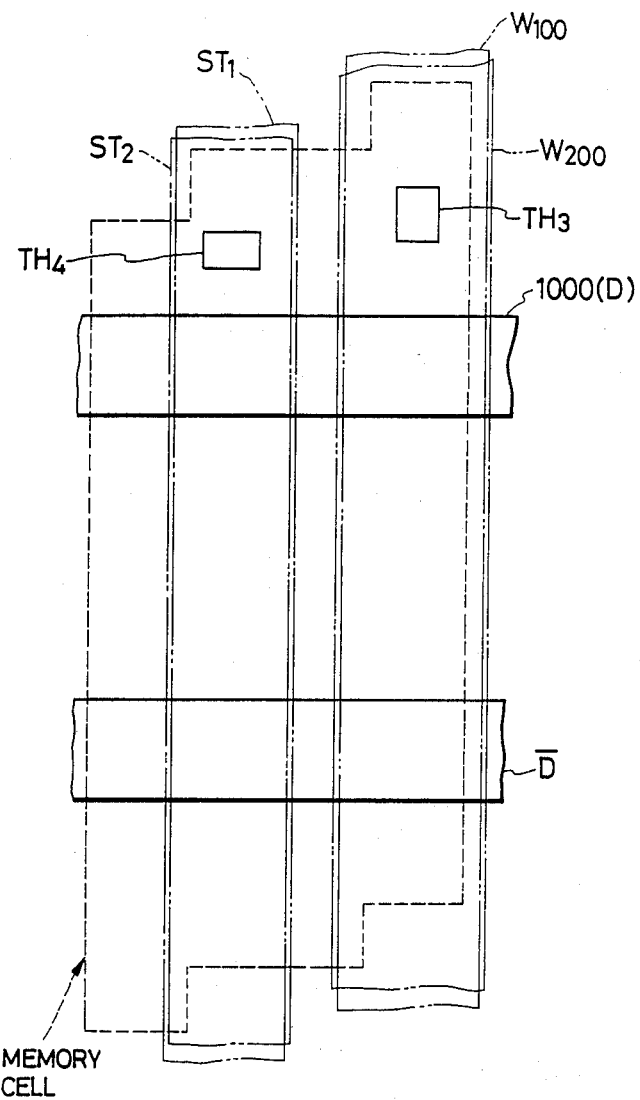
FIG. 6 shows a layout of signal lines of the static RAM acording to the third embodiment of the invention.

FIG. 6 shows the third embodiment of the invention where the layout and construction of the signal line (word line) are changed from the static RAM of FIG. 2.

According to this embodiment, a pair of the digit lines D and $\overline{D}$ are formed by the first aluminum layer, and the word line W and the hold current line ST are, respectively, formed by the second and third aluminum layers. Then, word lines W100 and W200 made of the second and third aluminum layers, are connected with each other at the through hole TH3 that is shown in FIG. 2; and hold current lines ST1 and ST2 made of the second and third aluminum layers, are connected with each other at the through hole TH4. And, in the embodiment, a distance of each wiring is made to the minimum which is determined by the lithography, and the wirings of the second and third layers are so formed as to have approximately the same dimensions: this is intended to decrease the wiring resistance, namely to increase the cross section within the range of width that the memory cell has.

Embodiment 4

Figure 7:
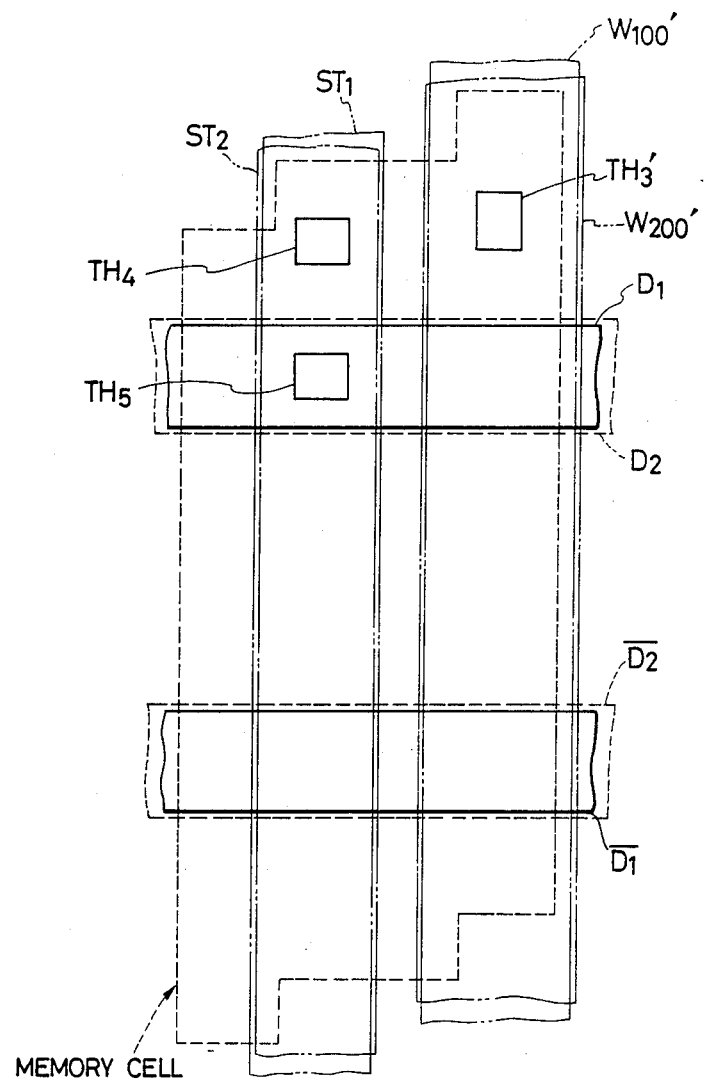
FIG. 7 shows a layout of signal lines of the static RAM according to the fourth embodiment of the invention.

FIG. 7 shows the fourth embodiment of the invention, in which the digit lines D and $\overline{D}$ are formed with the first and second aluminum layers, and the word line W and the hold current line ST are formed with the third and fourth aluminum layers. The digit lines D1, D2 ($\overline{D}1$, $\overline{D}2$) of the first and second layers are connected with each other by using a through hole TH5. The alphanumerics TH3' and TH4 show through holes to connect the upper and lower word lines and the hold current line ST.

In this embodiment, it is possible to high speed operation by decreasing the wiring resistance and increasing a current flowing through a digit line.

The digit line and the hold current line can be formed with a layer which stands at any number of order, so this is not restricted to the embodiment. And the construction and layout of memory cells are not restricted to the embodiment of FIG. 2. Moreover, the number of layers is not restricted to two: three or more layers are possible.

So far are described the embodiments of the inventive bipolar static RAM, where, among the signal lines that are arranged on a cell of the memory array, at least the word lines are constructed as pairs of conducting lines, so the wiring width can be narrowed without decreasing a cross section of the wiring; therefore, an effect that the circuit-occupied area is not restricted by the width of aluminum wirings, produces the results that the area occupied by the memory array or the memory cell can be decreased and that a random access memory of the smaller chip size can be produced.

Since, at least the word lines are constructed in pairs of conducting lines among the signal lines arranged on the cell of the memory array, there results a decrease in the wiring resistance; this leads to a decrease potential drop of the wiring and in the prevention in electromigration.

Although this invention has been described specifically in reference to the exemplified embodiments, it will be understood that various modifications may occur within the scope of this invention which is defined by the appended claims. In the embodiments, for example, the explanation is done for word lines, hold current lines and digit lines that are formed on a high-density memory array. However, this invention can also be applied to signal lines that are arranged, except for memory arrays, to word line driving circuits, sense-amplifier circuits and so on. Moreover, a wiring material is not restricted to aluminum, but Al-Si(2%) alloy or Al-Cu(3%)-Si(2%) alloy can be used for wirings.

This invention has mainly been described about the application to the signal lines of a bipolar, static random access memory; this is an application field of the inventive background. However, the invention is not restricted to this application; it can be used not only for power supply lines, but for wirings in general, for example in semiconductor integrated circuits, etc.

The following is a brief description of the effects that are obtained from the typical explanation of this invention.

That is, the chip size can be decreased in large-scale integrated circuits; a potential drop due to the wiring becomes small; and the electromigration will not occur.

What is claimed is:

1. A semiconductor memory device comprising:
a semiconductor body having a main surface;
a plurality of memory cells formed on said main surface, each memory cell having a pair of bipolar transistors;
a memory cell array including a plurality of word lines and a plurality of pairs of complementary digit lines coupled to said memory cells so that each memory cell is coupled to a word line and to a pair of complementary digit lines;
means for selecting at least one memory cell from among a plurality of said memory cells and including a plurality of word driver circuits, each word driver circuit including a bipolar output transistor which has an emitter thereof coupled to a corresponding word line and which output transistor provides via said word line a current to memory cells of a row of memory cells in said array which are coupled to the corresponding word line; and
wherein each word line includes first and second lines each made of a separate conductive layer material whose principal component is aluminum, and wherein said first and second lines are electrically connected to each other at predetermined intervals along the lengths of said first and second lines through respective openings formed in an insulating film which is interposed between the separate conductive layer materials which form said first and second lines.

2. A semiconductor memory device according to claim 1, wherein said first and second lines are extended over a region where said memory cells are formed, and wherein said first and second lines are vertically stacked over said region.

3. A semiconductor memory device according to claim 2, wherein a pair of said bipolar transistors are composed of first and second bipolar transistors, wherein a collector of said first transistor is coupled to a base of said second transistor and a collector of said second transistor is coupled to a base of said first transistor, and wherein each of said first and second transistors has an emitter coupled to a corresponding pair of complementary digit lines.

4. A semiconductor memory device according to claim 3, wherein each said memory cell further comprises a first load resistor coupling the collector of said first transistor to the corresponding word line and a second load resistor coupling the collector of said transistor to the corresponding word line.

5. A semiconductor memory device according to claim 4, wherein each said memory cell further comprises a Schottky barrier diode and a capacitor connected in parallel with each other between the collectors of each of said first and second bipolar transistors and said word line.

6. A semiconductor memory device according to claim 1, wherein each said word line includes first and second lines each made of the material whose principal component is the aluminum so as to effect an increase in current capacity of said word line.

7. A semiconductor memory device according to claim 1, wherein each memory cell is a bipolar SRAM cell comprised of said pair of bipolar transistors in a flip-flop arrangement wherein the collector and base of a first one of said transistor pair is coupled to the base and collector of the second transistor of said transistor pair, and wherein each of said first and second transistors has an emitter coupled to a corresponding pair of complementary digit lines.

8. A semiconductor memory device according to claim 7, wherein each said memory cell further comprises a Schottky barrier diode and a capacitor connected in parallel with each other between the collectors of each of said first and second bipolar transistors and said word line.

9. A semiconductor memory device according to claim 8, wherein each said word line includes first and second lines each made of the material whose principal component is the aluminum so as to effect an increase in current capacity of said word line.

10. A semiconductor memory device according to claim 9, wherein said second conductive layer material is disposed as a higher level wiring layer of a vertically stacked plural wiring layer arrangement of said memory device than is said first conductive layer material, and wherein in each word line said second line has a width which is greater than that of said first line.

11. A semiconductor memory device according to claim 10, wherein said first and second lines have a width of about 7 $\mu$m and 14 $\mu$m, respectively.

12. A semiconductor memory device according to claim 11, wherein said digit lines are disposed in another conductive layer material which corresponds to a lower level wiring layer than the wiring layer associated with said first conductive layer material in the vertically stacked wiring layer arrangement.

13. A semiconductor memory device according to claim 1, wherein said plurality of memory cells in said memory cell array are arranged as rows and columns of memory cells, wherein each row of memory cells is associated with a corresponding word line of said first and second lines, and wherein each row further includes a corresponding holding current conducting line comprised of at least one signal line.

14. A semiconductor memory device according to claim 13, wherein said holding current conducting line is comprised of a pair of signal lines formed in different wiring layers.

15. A semiconductor memory device according to claim 14, wherein said different wiring layers have formed thereat said first and second lines, respectively, of each said word line.

16. A semiconductor memory device according to claim 15, wherein in each of said word lines the first and second lines have substantially equal widths.

17. A semiconductor memory device according to claim 9, wherein said plurality of memory cells in said memory cell array are arranged as rows and columns, wherein each row of memory cells is associated with a corresponding word line of said first and second lines, and wherein each row further includes a corresponding holding current conducting line comprised of at least one signal line connected to respective second emitters of said pair bipolar transistors in each flip-flop arrangement associated with a corresponding row of memory cells.

18. A semiconductor memory device according to claim 17, wherein said holding current conducting line is comprised of a pair of signal lines formed in different wiring layers.

19. A semiconductor memory device according to claim 18, wherein said different wiring layers have formed thereat said first and second lines, respectively, of each said word line.

20. A semiconductor memory device according to claim 19, wherein in each of said word lines the first and second lines have substantially equal widths.

21. A semiconductor memory device according to claim 1, wherein said second conductive layer material is disposed as a higher level wiring layer of a vertically stacked plural wiring layer arrangement of said memory device than is said first conductive layer material, and wherein in each word line said second line has a width which is greater than that of said first line.

22. A semiconductor memory device according to claim 21, wherein said first and second lines have a width of about 7 $\mu$m and 14 $\mu$m, respectively.

* * * * *